US009922800B2

(12) United States Patent
Li et al.

(10) Patent No.: US 9,922,800 B2
(45) Date of Patent: Mar. 20, 2018

(54) SYSTEM AND METHOD FOR GENERATING IONS IN AN ION SOURCE

(71) Applicant: Taiwan Semiconductor Manufacturing Co., Ltd., Hsin-Chu (TW)

(72) Inventors: Ming-Hui Li, Taichung (TW); Stanley Chang, Wujie Township, Yilan County (TW); Po-Yi Tseng, Taichung (TW); Chia-Cheng Liu, Taichung (TW); Chang-Chun Wu, Taichung (TW); Shen-Han Lin, Taichung (TW); Chih-Wen Huang, Pingzhen (TW); Ming-Hsien Wu, Tainan (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 138 days.

(21) Appl. No.: 14/158,394

(22) Filed: Jan. 17, 2014

(65) Prior Publication Data
US 2015/0206690 A1 Jul. 23, 2015

(51) Int. Cl.
*H01L 21/26* (2006.01)
*H01J 37/317* (2006.01)
*H01J 37/08* (2006.01)
*H01J 49/10* (2006.01)
*H01L 21/265* (2006.01)

(52) U.S. Cl.
CPC .......... *H01J 37/3171* (2013.01); *H01J 37/08* (2013.01); *H01J 49/105* (2013.01); *H01L 21/265* (2013.01)

(58) Field of Classification Search
CPC .................................................... C23C 16/452
See application file for complete search history.

(56) References Cited

U.S. PATENT DOCUMENTS

| | | | | |
|---|---|---|---|---|
| 6,383,898 B1 * | 5/2002 | Kishimoto | ............ | H01L 31/076 438/482 |
| 7,137,354 B2 * | 11/2006 | Collins | ................ | H01J 37/321 118/723 I |
| 7,446,326 B2 | 11/2008 | Chaney et al. | | |
| 7,655,931 B2 * | 2/2010 | Gupta | ..................... | H01J 37/08 250/423 R |
| 7,921,675 B2 * | 4/2011 | Bookbinder | ...... | C03B 37/01853 65/413 |
| 7,973,293 B2 | 7/2011 | Lin et al. | | |
| 8,779,383 B2 * | 7/2014 | Mayer | ..................... | H01J 37/08 250/423 R |
| 8,803,112 B2 * | 8/2014 | Sinha | ...................... | H01J 37/08 250/424 |
| 2014/0179090 A1 * | 6/2014 | Sinha | ..................... | C23C 14/34 438/514 |

* cited by examiner

*Primary Examiner* — Zandra Smith
*Assistant Examiner* — Andre' C Stevenson
(74) *Attorney, Agent, or Firm* — McClure, Qualey & Rodack, LLP

(57) ABSTRACT

Embodiments of a method for generating ions in an ion source are provided. The method for generating ions in an ion source includes introducing a dopant gas and a diluent gas into an ion source arc chamber. The method for generating ions in an ion source further includes generating plasma in the ion source arc chamber based on the dopant gas and the diluent gas. In addition, the dopant gas includes carbon monoxide, and the diluent gas includes xenon and hydrogen.

20 Claims, 4 Drawing Sheets

SYSTEM AND METHOD FOR GENERATING IONS IN AN ION SOURCE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in the semiconductor devices is the higher levels of integration of circuits. This is accomplished by miniaturizing or shrinking device sizes on a given chip. Ion implant is a critical technology in the fabrication of semiconductor devices. Ion implanters are typically used for performing ion implantation processes. The ion implanters are used to provide doping for semiconductor devices, such that atoms are introduced to change the electrical properties of semiconductor materials.

However, although existing ion implant processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
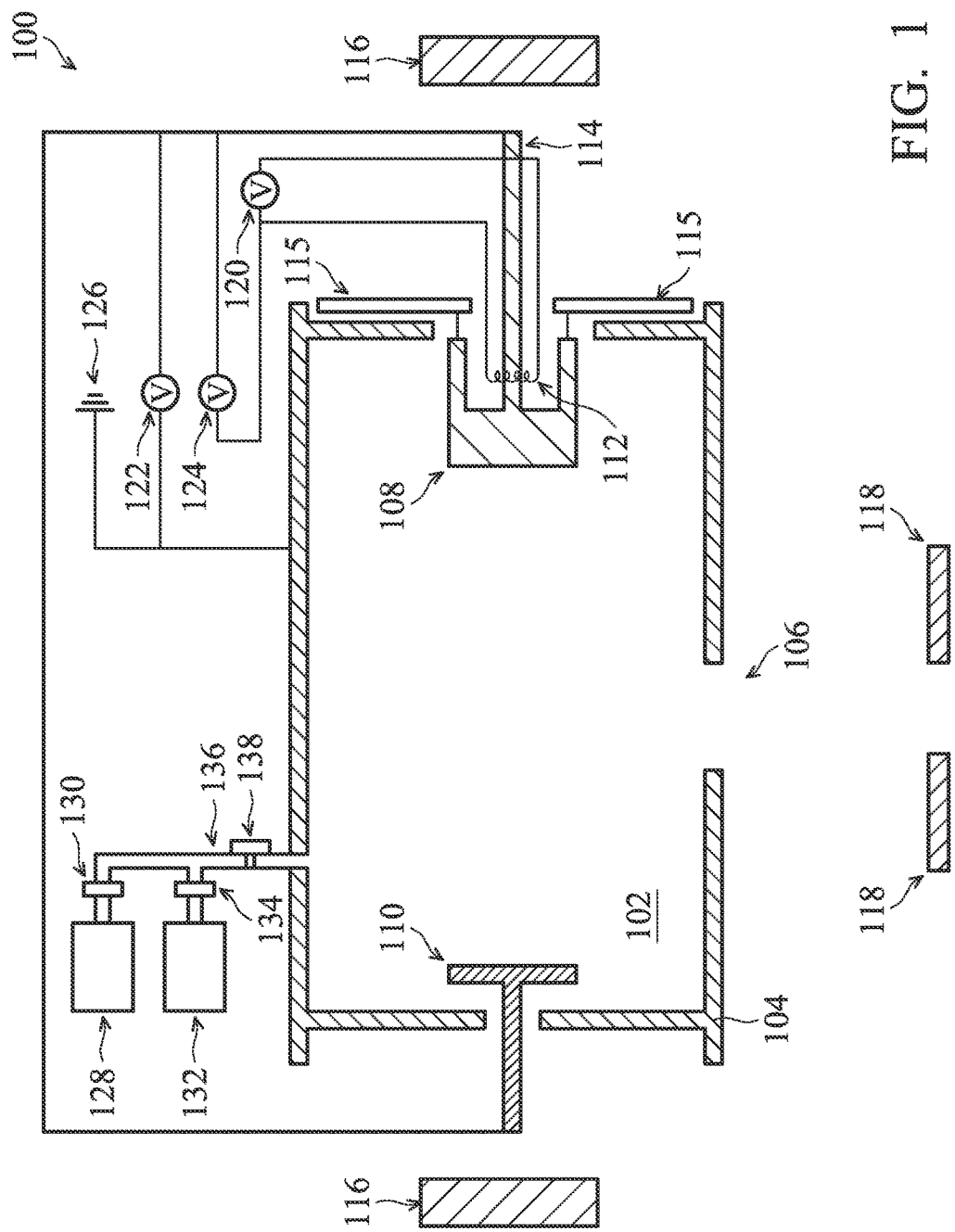
FIG. 1 is a schematic diagram of a system 100 for generating ions in an ion source in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for generating ions in an ion source are provided in accordance with some embodiments of the disclosure. FIG. 1 is a schematic diagram of a system 100 for generating ions in an ion source in accordance with some embodiments. In some embodiments, system 100 includes an ion source in an ion implanter, such as an inductively heated cathode (IHC) ion source used in high current ion implantation equipment. However, system 100 may include other types of ions sources, and the scope of the disclosure is not intended to be limiting.

As shown in FIG. 1, system 100 includes an ion source arc chamber 102 in accordance with some embodiments. In addition, ion source arc chamber 102 has an arc chamber housing 104 and an extraction opening 106 at a side of arc chamber housing. Extraction opening 106 is configured to expel ions and/or other impurities generated in ion source arc chamber 102. Materials for forming arc chamber housing 104 may include, but are not limited to, tungsten, although other conductive materials may additionally or alternatively be used to form arc chamber housing 104.

A cathode 108 and a repeller 110 (or anticathode) are positioned within ion source arc chamber 102 in accordance with some embodiments. As shown in FIG. 1, cathode 108 is positioned at one side of ion source arc chamber 102, and repeller 110 is positioned at the opposite side of ion source arc chamber 102. In addition, repeller 110 at the other end of ion source arc chamber 102 may be biased at the same or a similar potential as cathode 108 to repel energetic electrons formed in ion source arc chamber 102. Materials for forming cathode 108 may include, but are not limited to, tungsten, although other conductive materials may additionally or alternatively be used to form cathode 108. Materials for forming repeller 110 may include, but are not limited to, tungsten, although other conductive materials may additionally or alternatively be used to form repeller 110.

A filament 112 is positioned outside ion source arc chamber 102 but close to cathode 108 in accordance with some embodiments. Filament 112 is configured to heat cathode 108. In addition, a support rod 114 is coupled to cathode 108 in accordance with some embodiments. Support rod 114 is configured to support cathode 108 and filament 112. Furthermore, shields 115 are also coupled to cathode 108 to prevent gas in ion source arc chamber 102 from leaking out. Materials for forming filament 112 may include, but are not limited to, tungsten, although other conductive materials may additionally or alternatively be used to form filament 112. Materials for forming support rod 114 may include, but are not limited to, tungsten, although other conductive materials may additionally or alternatively be used to form support rod 114. Materials for forming shields 115 may include, but are not limited to, graphite, although other materials may additionally or alternatively be used to form shields 115.

Source magnets 116 are provided outside ion source arc chamber 102 in accordance with some embodiments. Source magnets 116 are configured to produce a magnetic field within ion source arc chamber 102 and therefore to confine the energetic electrons formed in ion source arc chamber 102. It should be noted that, although two source magnets 116 are illustrated in FIG. 1, one or more than two source magnets 116 are utilized for generating a magnetic field in accordance with some other embodiments.

Extraction electrodes 118 are positioned in front of extraction aperture 106 outside ion source arc chamber 102 in accordance with some embodiments. Extraction electrodes 118 are configured to extract ions from the plasma formed in ion source arc chamber 102.

A filament power supply 120 is coupled to filament 112 in accordance with some embodiments. Filament power supply 120 is configured to provide a current to filament 112. The current heats filament 112 to cause thermionic emission of electrons.

An arc power supply 122 is coupled to arc chamber housing 104 in accordance with some embodiments. Arc power supply 122 is configured to bias arc chamber housing 104 with respect to cathode 108, such that the electrons are accelerated at a high energy in ion source arc chamber 102. Therefore, the electrons emitted by cathode 108 are accelerated, and plasma is formed within ion source arc chamber 102.

A bias power supply 124 is coupled to cathode 108 in accordance with some embodiments. Bias power supply 124 is configured to bias cathode 108 at a potential higher than that on filament 114 to heat up cathode 108. The heated cathode 108 may then emit electrons into ion source arc chamber 102. Furthermore, a source ground 126 is coupled to arc chamber housing 104 as a terminal point in accordance with some embodiments.

A dopant gas source 128 is coupled to ion source arc chamber 102 in accordance with some embodiments. Dopant gas source 128 is configured to introduce a dopant gas to ion source arc chamber 102. In some embodiments, dopant gas source 128 is a gas bottle or a reservoir. In some other embodiments, dopant gas source 128 includes an oven that heats up a substance to produce a desired gas. In some embodiments, the dopant gas comprises carbon monoxide (CO).

In addition, a first flow meter 130 communicates with dopant gas source 128 in accordance with some embodiments. First flow meter 130 is configured to control the amount of the dopant gas being introduced to ion source arc chamber 102.

In some embodiments, the dopant gas is introduced to ion source arc chamber 102 at a first flow rate controlled by first flow meter 130. In some embodiments, the first flow rate of the dopant gas is in a range of about 1 sccm to about 5 sccm. In some embodiments, the first flow rate of the dopant gas is in a range of about 2.5 sccm to about 5 sccm.

A diluent gas source 132 is coupled to ion source arc chamber 102 in accordance with some embodiments. Diluent gas source 132 is configured to introduce a diluent gas to ion source arc chamber 102. In some embodiments, the diluent gas comprises xenon (Xe) and hydrogen ($H_2$). In some embodiments, a volume ratio of xenon to hydrogen is in a range from about 1:0. 11-1.

In addition, a second flow meter 134 is in communication with diluent gas source 132 in accordance with some embodiments. Second flow meter 134 is configured to control the amount of the diluent gas being introduced to ion source arc chamber 102.

In some embodiments, the diluent gas is introduced to ion source arc chamber 102 at a second flow rate controlled by second flow meter 134, and the second flow rate of the diluent gas is in a range of about 0.5 sccm to about 1 sccm. In some embodiments, a ratio of the first flow rate to the second flow rate is in a range from about 1:0. 1-1.

As shown in FIG. 1, dopant gas source 128 and diluent gas source 132 are both in communication with ion source arc chamber 102 through a conduit 136 in accordance with some embodiments. More specifically, the dopant gas supplied by dopant gas source 128 and the diluent gas supplied by diluent gas source 132 are mixed in a conduit 136. In addition, a valve 138 is coupled to conduit 136 for controlling the amount of the mixed gas (i.e. a mixture of the dopant gas and the diluent gas) being introduced to ion source arc chamber 102 in accordance with some embodiments.

Figure 2:
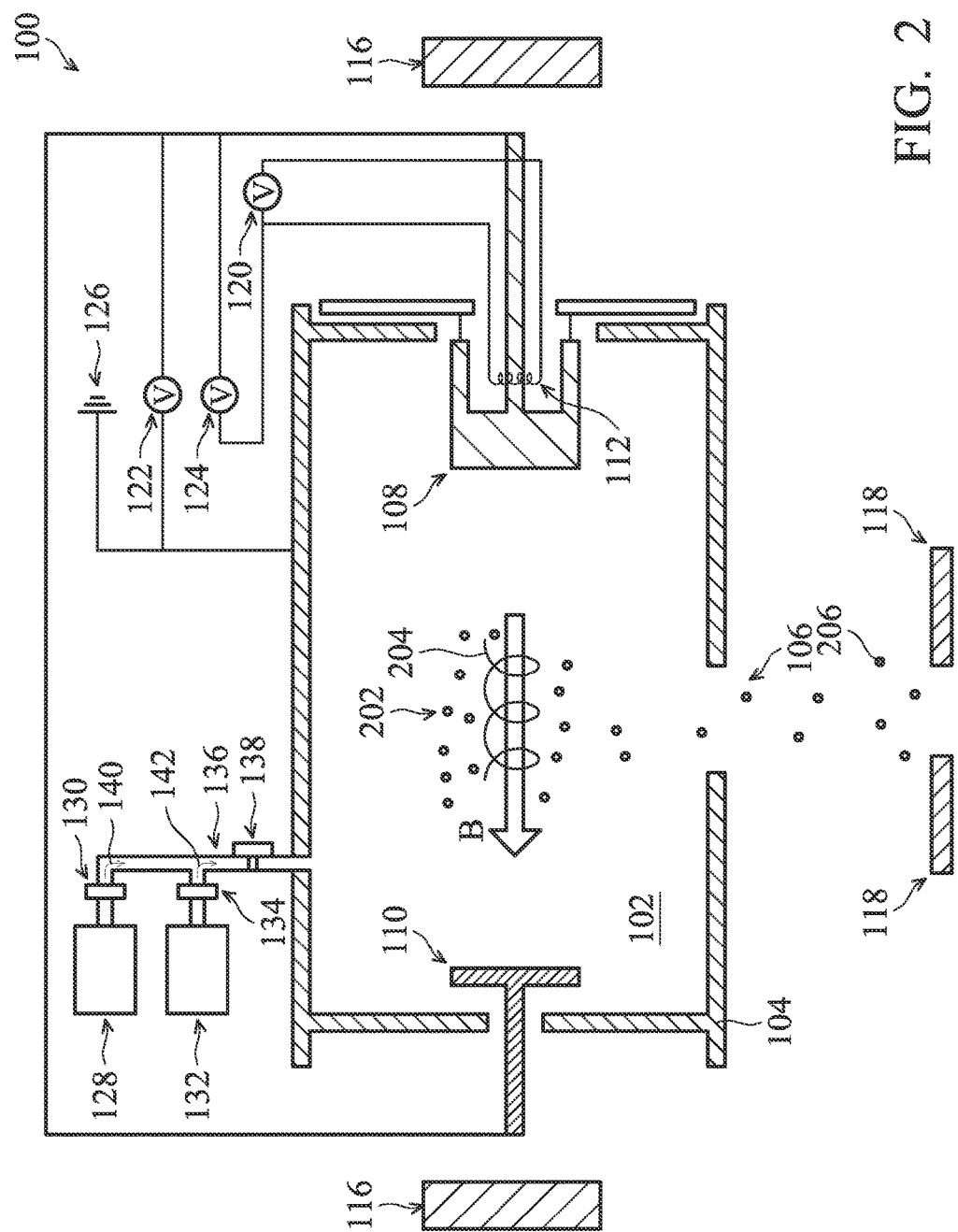
FIG. 2 is a schematic diagram of a system illustrated in FIG. 1 during a process for generating ions in an ion source in accordance with some embodiments.

FIG. 2 is a schematic diagram of system 100 illustrated in FIG. 1 during a process for generating ions in an ion source in accordance with some embodiments. An arrow 140 illustrates the direction of the dopant gas. The dopant gas is introduced to ion source arc chamber 102 by dopant gas source 128 in accordance with some embodiments. In addition, an arrow 142 illustrates the direction of the diluent gas. The diluent gas is introduced to ion source arc chamber 102 by diluent gas source 132 in accordance with some embodiments.

In some embodiments, the dopant gas and the diluent gas are provided to ion source arc chamber 102 via the same conduit 136, as shown in FIG. 2. Therefore, the dopant gas and the diluent gas are pre-mixed in conduit 136 before entering ion source arc chamber 102. However, in some other embodiments, the dopant gas and the diluent gas are provided into ion source arc chamber 102 via different conduits. That is, the dopant gas and the diluent gas may be mixed in ion source arc chamber 102 instead of in ion source arc chamber 102, and the scope of the disclosure is not intended to be limiting.

After the dopant gas and the diluent gas are introduced to ion source arc chamber 102, filament 112 is heated to a thermionic emission temperature by filament power supply 120, and electrons emitted by filament 112 bombard cathode 108 in accordance with some embodiments. Cathode 108 is also heated to the thermionic emission temperature.

Electrons emitted by cathode 108 are accelerated, and gas molecules of the dopant gas and the diluent gas are ionized in accordance with some embodiments. As a result, plasma 202 is generated in ion source arc chamber 102. In some embodiments, the electrons formed in ion source arc chamber 102 follows a spiral trajectory of a magnetic field B to increase the number of ionizing collisions. In addition, repeller 110 may build up a negative charge to repel the electrons back through ion source arc chamber 102 for producing additional ionizing collisions.

Next, ions 206 are extracted from plasma 202 in accordance with some embodiments. More specifically, ions 206 are extracted from ion source arc chamber 102 through extraction aperture 106 by extraction electrodes 118.

In some embodiments, the dopant gas provided by dopant gas source 128 is CO, and the diluent gas provided by diluent gas source 132 is a mixture of Xe and $H_2$. Accordingly, ions 206 extracted from ion source arc chamber 102 include carbon ions.

In general, carbon dioxide ($CO_2$) may also be used as a dopant gas to generate carbon ions. However, a great quantity of oxygen ions may also be formed during the process. The oxygen ions tend to react with metallic materials to form metal oxide, and therefore cathode 108, arc chamber housing 104, or other units in ion source arc chamber 102 may be polluted by the metal oxide formed thereon. Accordingly, the life time of system 100 is reduced. In addition, the metal oxide formed on cathode 108 may be further ionized and mixed in plasma 202. Therefore, ions 206 extracted from plasma 202 may be contaminated by metal ions such as tungsten ions.

On the other hand, carbon monoxide (CO) is used as the dopant gas in accordance with some embodiments. Carbon ions can be generated from carbon monoxide, while fewer oxygen ions are formed during the process. In addition, hydrogen ($H_2$) is used as the diluent gas in accordance with some embodiments. The hydrogen will react with the oxygen ions formed in ion source arc chamber 102, such as to form $H_2O$, and therefore less metal oxide is formed in ion source arc chamber 102. The resulting $H_2O$ may be expelled from ion source arc chamber 102 and therefore will not pollute the units in ion source arc chamber 102. Since less metal oxide is formed in ion source arc chamber 102, the life time of system 100 is increased. In addition, a greater quantity of ions 126 can be extracted from ion source arc chamber 102 for having less pollution formed therein.

In addition, xenon (Xe) is also used as the diluent gas in accordance with some embodiments. Xe is configured to assist ignition in ion source arc chamber 102. In addition, Xe is an inert gas. Therefore, Xe will not react with the units in ion source arc chamber 102, and the performance of system 100 will not be affected.

It should be noted that, although other compounds such as $PH_3$ may also be used as the diluent gas, $PH_3$ is not capable of assisting the ignition. In addition, although $PH_3$ also includes hydrogen to reduce the formation of the metal oxide, the P in $PH_3$ may also form contaminants on the units in ion source arc chamber 102 (e.g. cathode 108, arc chamber housing 104, or the like).

In some embodiments, a volume ratio of carbon monoxide to xenon to hydrogen introduced to ion source arc chamber 102 is in a range from about 1:0.1-0.5: 0.1-0.5. When the amount of carbon monoxide in ion source arc chamber 102 is too great, too many oxygen ions may be formed and the resulting metal oxide may pollute ion source arc chamber 102. When the amount of carbon monoxide in ion source arc chamber 102 is too small, the quantity of carbon ions extracted from plasma 202 may be too small.

Figure 3:
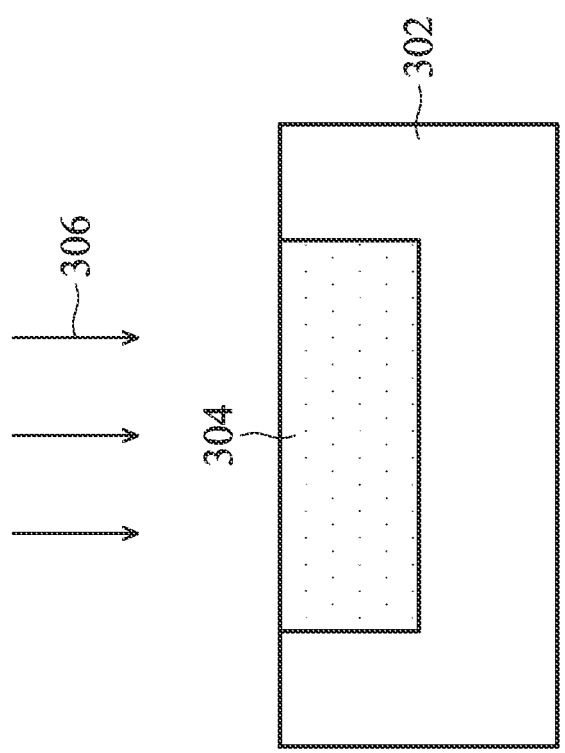
FIG. 3 illustrates a cross-sectional representation of a semiconductor substrate in accordance with some embodiments.

FIG. 3 illustrates a cross-sectional representation of a semiconductor substrate 302 in accordance with some embodiments. More specifically, ions 206 extracted from ion source arc chamber 102 illustrated in FIG. 2 is further used to implant semiconductor substrate 302.

Semiconductor substrate 302 may be a semiconductor wafer such as a silicon wafer. Alternatively or additionally, semiconductor substrate 302 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, substrate 302 includes structures such as doped regions, isolation features, interlayer dielectric (ILD) layers, and/or conductive features. In addition, semiconductor substrate 302 may further include single or multiple material layers to be patterned. For example, the material layers may include a silicon layer, a dielectric layer, and/or a doped polysilicon layer. In addition, semiconductor substrate 302 may include a device region in accordance with some embodiments. The device region may include active components or circuits, such as conductive features, implantation regions, resistors, capacitors, and/or other applicable semiconductor elements (e.g. transistors, diodes, or the like).

As shown in FIG. 3, ions 206 shown in FIG. 2 are implanted to semiconductor substrate 302 in accordance with some embodiments. A doped region 304 is formed in semiconductor substrate 302. In some embodiments, doped region 304 is formed by performing an implantation process 306 on semiconductor substrate 302.

In some embodiments, an implantation energy utilized in implantation process 306 is in a range from about 2 keV to about 7 keV. In some embodiments, an implantation beam current is in a range from about 3 mA to about 9 mA. In some embodiments, implantation time is in a range from about 20 seconds to about 120 seconds. In some embodiments, an implantation dosage is in a range from about $1 \times 10^{14}$ to about $5 \times 10^{15}$.

It should be noted that ions 206 extracted from ion source arc chamber 102 may be further processed before implantation process 306 is performed. For example, ions 206 extracted from ion source arc chamber 102 are first filtered and purified, and implantation process 306 is performed afterwards.

Figure 4:
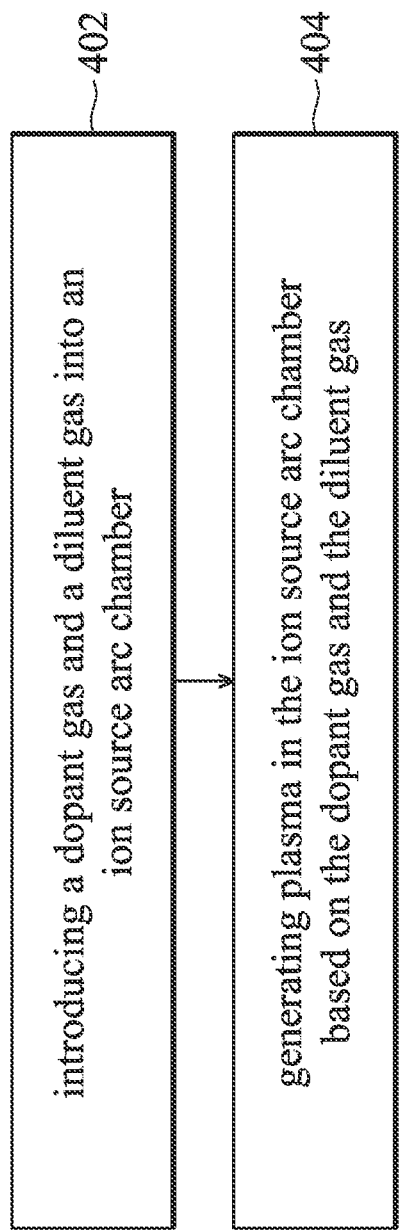
FIG. 4 is a flow chart of a method for generating ions in an ion source in accordance with some embodiments.

FIG. 4 illustrates a flow chart of a method for generating ions in an ion source in accordance with some embodiments. In some embodiments, system 100 shown in FIG. 2 is used to perform the method. In operation 402, a dopant gas and a diluent gas are introduced into an ion source arc chamber in accordance with some embodiments. More specifically, the dopant gas is introduced to the ion source arc chamber at a first flow rate, and the diluent gas is introduced to the ion source arc chamber at a second flow rate.

In some embodiments, the dopant gas is provided by dopant gas source 128, and the diluent gas is provided by diluent gas source 132 illustrated in FIG. 2. In some embodiments, the dopant gas includes carbon monoxide, and the diluent gas includes xenon and hydrogen. In some embodiments, the ion source arc chamber is ion source arc chamber 102 illustrated in FIG. 2, and other units, such as cathode 108, repeller 110, or the like, are further coupled to ion source arc chamber 102.

In operation 404, plasma is generated in the ion source arc chamber based on the dopant gas and the diluent gas in accordance with some embodiments. In some embodiments, the plasma is plasma 202 shown in FIG. 2, and ions 206 are extracted from plasma 202. In some embodiments, ions 206 are carbon ions. Furthermore, the ions extracted from the plasma may be implanted to a semiconductor substrate, such as semiconductor substrate 302 shown in FIG. 3.

As described above, the dopant gas provided by dopant gas source 128 is carbon monoxide, and the diluent gas provided by diluent gas source 132 is a mixture of xenon and hydrogen in accordance with some embodiments. The xenon can assist ignition in the ion source arc chamber, and the hydrogen can reduce the formation of metal oxide (e.g. tungsten oxide).

In general, if the metal oxide is formed in ion source arc chamber 102, the metal oxide may attach onto the units in ion source arc chamber 102, such as cathode 108, thereby polluting the ion source arc chamber 102. When a great amount of the metal oxide is formed in ion source arc chamber 102, system 100 may have to be shut down and cleaned. Therefore, the life time of system 100 may depend on the speed of metal oxide formation in ion source arc chamber 102.

Accordingly, since the hydrogen in the diluent gas can be used to reduce the formation of metal oxide, the life time of system 100 is prolonged. In addition, the cost of generating ions 206 is also reduced.

Furthermore, since the formation of metal oxide is reduced, more ions 206 can be generated. In some embodiments, the beam current in system 100 is 1.5 times greater than that in a system that does not use the diluent gas including xenon and hydrogen. Therefore, the productivity of system 100 is improved.

Embodiments for generating ions in an ion source are provided. A dopant gas and a diluent gas are introduced in an ion source arc chamber. Plasma is generated from the dopant gas and the diluent gas in the ion source arc chamber. The diluent gas includes xenon and hydrogen. The xenon is configured to assist ignition in the ion source arc chamber. In addition, the hydrogen is configured to reduce the formation of metal oxide, which tends to pollute units in the ion source arc chamber. Therefore, the life time of the system is prolonged, and the productivity of the system is improved.

In some embodiments, a method for generating ions in an ion source is provided. The method for generating ions in an ion source includes introducing a dopant gas and a diluent gas into an ion source arc chamber. The method for generating ions in an ion source further includes generating plasma in the ion source arc chamber based on the dopant gas and the diluent gas. In addition, the dopant gas includes carbon monoxide, and the diluent gas includes xenon and hydrogen.

In some embodiments, a method for generating ions in an ion source is provided. The method for generating ions in an ion source includes introducing a dopant gas to an ion source arc chamber at a first flow rate and introducing a diluent gas to the ion source arc chamber at a second flow rate. The method for generating ions in an ion source further includes generating plasma in the ion source arc chamber from the dopant gas and the diluent gas. The method for generating ions in an ion source further includes extracting carbon ions from the plasma. In addition, the diluent gas comprises xenon and hydrogen.

In some embodiments, a system for generating ions in an ion source is provided. The system for generating ions in an ion source includes an ion source arc chamber having an arc chamber housing. The system for generating ions in an ion source further includes a dopant gas source coupled to the ion source arc chamber for introducing a dopant gas to the ion source arc chamber. The system for generating ions in an ion source further includes a diluent gas source coupled to the ion source arc chamber for introducing a diluent gas to the ion source arc chamber. In addition, the dopant gas includes carbon monoxide and the diluent gas includes xenon and hydrogen, and the dopant gas and the diluent gas are configured to generate ions in the ion source arc chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure comprising:
   introducing a dopant gas by a dopant gas source and a diluent gas by a diluent gas source into an ion source arc chamber;
   ionizing gas molecules of the dopant gas and the diluent gas to generate plasma in the ion source arc chamber;
   extracting ions from the plasma in the ion source arc chamber; and
   implanting the ions into a semiconductor substrate to form a doped region in the semiconductor substrate,
   wherein the dopant gas comprises carbon monoxide, and the diluent gas comprises xenon and hydrogen, and a volume ratio of carbon monoxide to xenon to hydrogen introduced to the ion source arc chamber is in a range from 1:0.1-0.5:0.1-0.5.

2. The method for manufacturing a semiconductor structure as claimed in claim 1, wherein the dopant gas is introduced to the ion source arc chamber at a first flow rate in a range of about 1 sccm to about 5 sccm.

3. The method for manufacturing a semiconductor structure as claimed in claim 1, wherein the dopant gas is introduced to the ion source arc chamber at a first flow rate in a range of about 2.5 sccm to about 5 sccm.

4. The method for manufacturing a semiconductor structure as claimed in claim 1, wherein the dopant gas is introduced to the ion source arc chamber at a first flow rate, and the diluent gas is introduced to the ion source arc chamber at a second flow rate, and a ratio of the first flow rate to the second flow rate is in a range from about 1:0.1-1.

5. The method for manufacturing a semiconductor structure as claimed in claim 1, wherein the diluent gas is introduced to the ion source arc chamber at a second flow rate in a range of about 0.5 sccm to about 1 sccm.

6. The method for manufacturing a semiconductor structure as claimed in claim 1, wherein the ions are extracted from the plasma in the ion source arc chamber by extraction electrodes.

7. The method for manufacturing a semiconductor structure as claimed in claim 1, wherein the dopant gas and the diluent gas are mixed in a conduit.

8. The method for manufacturing a semiconductor structure as claimed in claim 7, wherein a valve is coupled to the conduit for controlling the amount of a mixture of the dopant gas and the diluent gas being introduced to the ion source arc chamber.

9. A method for generating ions in an ion source, comprising:
   introducing a dopant gas and a diluent gas into an ion source arc chamber; and
   generating plasma in the ion source arc chamber based on the dopant gas and the diluent gas;
   wherein the dopant gas comprises carbon monoxide, and the diluent gas comprises xenon and hydrogen, and the diluent gas is introduced to the ion source arc chamber at a flow rate in a range of about 0.5 sccm to about 1 sccm.

10. A method for producing an ion-implanted semiconductor substrate by generating ions in an ion source, comprising:
    introducing a dopant gas by a dopant gas source and a diluent gas by a diluent gas source into an ion source arc chamber;

ionizing gas molecules of the dopant gas and the diluent gas to generate plasma in the ion source arc chamber;

extracting carbon ions from the plasma in the ion source arc chamber; and implanting the carbon ions into a semiconductor substrate to form an ion-implanted semiconductor substrate, wherein the dopant gas comprises carbon monoxide, and the diluent gas comprises xenon and hydrogen, and a volume ratio of carbon monoxide to xenon to hydrogen introduced to the ion source arc chamber is in a range from 1:0.1-0.5:0.1-0.5.

11. The method for producing an ion-implanted semiconductor substrate by generating ions in an ion source as claimed in claim 10, wherein the dopant gas is introduced to the ion source arc chamber at a first flow rate, and the diluent gas is introduced to the ion source arc chamber at a second flow rate, and a ratio of the first flow rate to the second flow rate is in a range from 1:0.1-1.

12. The method for producing an ion-implanted semiconductor substrate by generating ions in an ion source as claimed in claim 11, further comprising:

implanting the carbon ions to a semiconductor substrate.

13. The method for producing an ion-implanted semiconductor substrate by generating ions in an ion source as claimed in claim 12, wherein the semiconductor substrate is a wafer.

14. The method for producing an ion-implanted semiconductor substrate by generating ions in an ion source as claimed in claim 12, wherein the diluent gas is introduced to the ion source arc chamber at a flow rate in a range of about 0.5 sccm to about 1 sccm.

15. The method for producing an ion-implanted semiconductor substrate by generating ions in an ion source as claimed in claim 10, wherein the diluent gas is introduced to the ion source arc chamber at a flow rate in a range of about 0.5 sccm to about 1sccm.

16. The method for generating ions in an ion source as claimed in claim 9, wherein the dopant gas is introduced to the ion source arc chamber at a flow rate in a range of about 2.5 sccm to about 5 sccm.

17. The method for generating ions in an ion source as claimed in claim 9, wherein the dopant gas and the diluent gas are mixed in a conduit, and a valve is coupled to the conduit for controlling the amount of a mixture of the dopant gas and the diluent gas being introduced to the ion source arc chamber.

18. The method for manufacturing a semiconductor structure as claimed in claim 8, wherein a first flow meter is communicated with the dopant gas source to control the amount of the dopant gas being introduced to the ion source arc chamber, and a second flow meter is communicated with the diluent gas source to control the amount of the diluent gas being introduced to the ion source arc chamber.

19. The method for manufacturing a semiconductor structure as claimed in claim 1, further comprising:

emitting electrons from a cathode in the ion source arc chamber to ionize the gas molecules of the dopant gas and the diluent gas.

20. The method for manufacturing a semiconductor structure as claimed in claim 1, wherein the ions are implanted into the semiconductor substrate under an implantation energy in a range from about 2 keV to about 7keV.

* * * * *